US007607350B2

(12) United States Patent
Choi

(10) Patent No.: US 7,607,350 B2
(45) Date of Patent: Oct. 27, 2009

(54) CIRCUIT BOARD MOUNTING FOR TEMPERATURE STRESS REDUCTION

(75) Inventor: Youngmin A. Choi, Agoura Hills, CA (US)

(73) Assignee: Northrop Grumman Guidance and Electronics Company, Inc., Woodland Hills, CA (US)

( * ) Notice: Subject to any disclaimer, the term of this patent is extended or adjusted under 35 U.S.C. 154(b) by 312 days.

(21) Appl. No.: 11/244,464

(22) Filed: Oct. 6, 2005

(65) Prior Publication Data

US 2007/0081317 A1  Apr. 12, 2007

(51) Int. Cl.
*G01P 9/04* (2006.01)
*G01C 19/56* (2006.01)
*G01P 1/02* (2006.01)

(52) U.S. Cl. ...................... 73/504.13; 73/493

(58) Field of Classification Search .............. 73/493, 73/504.13, 431
See application file for complete search history.

(56) References Cited

U.S. PATENT DOCUMENTS

| | | | | |
|---|---|---|---|---|
| 4,157,041 A * | 6/1979 | Loper et al. | .............. | 73/504.13 |
| 4,759,216 A * | 7/1988 | Carpenter et al. | ............. | 73/182 |
| 4,985,655 A * | 1/1991 | Jensik et al. | ................ | 310/344 |
| 5,132,038 A * | 7/1992 | Kukanskis et al. | .......... | 510/175 |
| 5,334,897 A * | 8/1994 | Ineson et al. | .................. | 310/89 |
| 5,774,328 A * | 6/1998 | Rector et al. | ................ | 361/667 |
| 6,274,224 B1 * | 8/2001 | O'Bryan et al. | ............. | 428/209 |
| 7,181,968 B2 * | 2/2007 | Still | ........................... | 73/493 |

* cited by examiner

*Primary Examiner*—Helen C. Kwok
(74) *Attorney, Agent, or Firm*—Carmen Patti Law Group, LLC

(57) ABSTRACT

A circuit board mounting system in one example comprises an improved mounting system for a circuit board disposed between housing elements, wherein the improvement comprises a plurality of slots formed in the circuit board and a plurality of bushings disposed within the slots, such that the housing elements rest on opposed ends of the bushings, and the circuit board moves in a plane substantially parallel to its mounting surfaces in response to changes in temperature, thus reducing thermal stress.

29 Claims, 10 Drawing Sheets
CIRCUIT BOARD MOUNTING FOR TEMPERATURE STRESS REDUCTION

BACKGROUND

This application is directed generally to temperature stress reduction in mechanical assemblies and in particular to improved mounting for a circuit board used in conjunction with a plurality of interconnected assemblies, and is more particularly directed toward improved circuit board mounting for temperature stress reduction in a vibratory rotation sensor.

Complex electro-mechanical systems are often designed and implemented in a modular fashion. In other words, there may be a module (or subassembly) that contains most or all of the electromechanical components, as well as electrical drivers and sensors. Another module or subassembly, interconnected with the first, may then include electronic circuitry to provide necessary drive signals, amplify and/or filter sensor outputs, and provide computational or signal processing resources. The separation of system components into modules, as described above, may often be dictated by manufacturing concerns, efficient testing of manufactured assemblies, or proper interoperability of system components.

Of course, the modules or subassemblies must then be assembled into an integrated product. This often means that an electromechanical subassembly must be interconnected with an electrical connection header, for example, as well as one or more circuit boards containing electronic components. Particularly where size of the finished product is a concern, this generally means that the modules or subassemblies will be in close proximity to one another, making at least mechanical contact with one another, and often both mechanical and electrical contact. There is also generally a need to provide a housing around the modules or sub-assemblies, and the housing also is generally in at least mechanical contact with one or more of the system modules.

Many modern electro-mechanical systems must be designed to operate in harsh environments, including extremes of temperature. Since the modules and sub-assemblies of the integrated product often have different coefficients of thermal expansion (CTEs), as do the mechanical housing components of such a system, thermal stress related to these differing CTEs, over a wide operating temperature range, is of significant concern to system designers.

SUMMARY

The invention in one implementation encompasses a mounting system. The system comprises an improved mounting system for a circuit board disposed between housing elements, wherein the improvement comprises a plurality of slots formed in the circuit board and a plurality of bushings disposed within the slots, such that the housing elements rest on opposed ends of the bushings, and the circuit board moves in a plane substantially parallel to its mounting surfaces in response to changes in temperature, thus reducing thermal stress.

Another implementation of the invention encompasses a method. The method comprising the steps of providing a circuit board disposed within first and second housing elements, providing a plurality of slots in the circuit board, disposing a plurality of bushings within the slots, and resting the housing elements on opposed ends of the bushings, such that the circuit board moves in a plane substantially parallel to its mounting surfaces in response to changes in temperature, thus reducing thermal stress.

DESCRIPTION OF THE DRAWINGS

Features of exemplary implementations of the invention will become apparent from the description, the claims, and the accompanying drawings in which:

DETAILED DESCRIPTION

A vibratory rotation sensor is a type of complex electro-mechanical assembly that is often subjected to environmental extremes during normal operation. These environmental extremes often include a very broad operating temperature range, so the vibratory rotation sensor must be designed to operate accurately and reliably over extremes of temperature.

Figure 1:
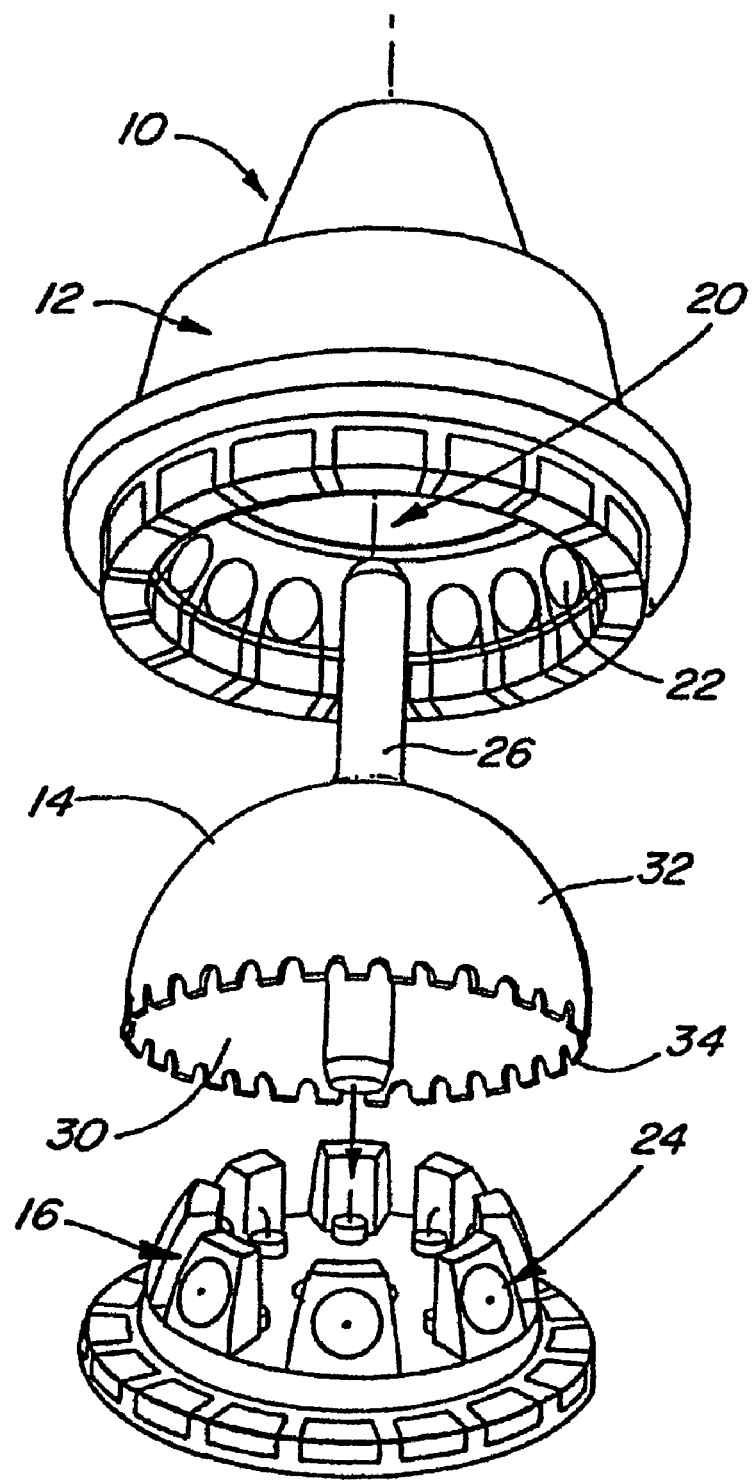
FIG. 1 is a representation of a vibratory rotation sensor of the prior art.

FIG. 1 is a simplified view of a portion of a vibratory rotation sensor 10 as known in the art. The vibratory rotation sensor 10 includes an outer support structure 12, a resonator 14 of generally hemispherical shape, and an inner support structure 16. Both support structures 12, 16, as well as the resonator 14 itself, are preferably formed from quartz. The vibratory rotation sensor 10 is often termed a "hemispherical resonator gyro" (HRG) because it utilizes changes in vibration patterns on the thin-walled hemispherical quartz resonator 14 to detect when it is moved. The thin-walled hemispherical quartz resonator 14 is excited by an electrical field to induce a pattern of mechanical vibration. This pattern is electrically detected and used to determine changes in the HRG's subtle mechanical vibration. The mechanical disturbance in the resonator 14 is so small that there is virtually no mechanical stress or fatigue induced in the resonator 14, and therefore the device itself is a high-reliability electro-mechanical system.

As noted, an electrical excitation is required in order to induce an appropriate vibration of the resonator 14 such that standing waves may be established. To provide the excitation, a plurality of electrodes 22 are provided on an interior surface 20 of the outer support structure 12. These electrodes 22 are in close proximity to the outer surface 32 of the resonator 14, which is metallized. When an electrical signal is applied to selected electrodes 22, mechanical vibration is induced in the resonator 14 with the desired standing wave pattern.

When the HRG 10 rotates about its axis, the standing wave pattern established in the resonator 14 rotates in the opposite direction. Consequently, by measuring the angle of rotation of the standing wave pattern, the rotation angle of the HRG 10 can be determined. Output signals from the resonator 14 are obtained through capacitive coupling between a plurality of output electrodes 24 and the metallized interior surface 30 of the resonator 14. The output electrodes 24 are disposed on the inner support structure 16. The vibration mode of the resonator 14 causes changes in capacitance that are readily measured at the output electrodes 24. This capacitance data is sufficient to enable sensing circuitry to establish the degree of rotation of the HRG 10.

Figure 2:
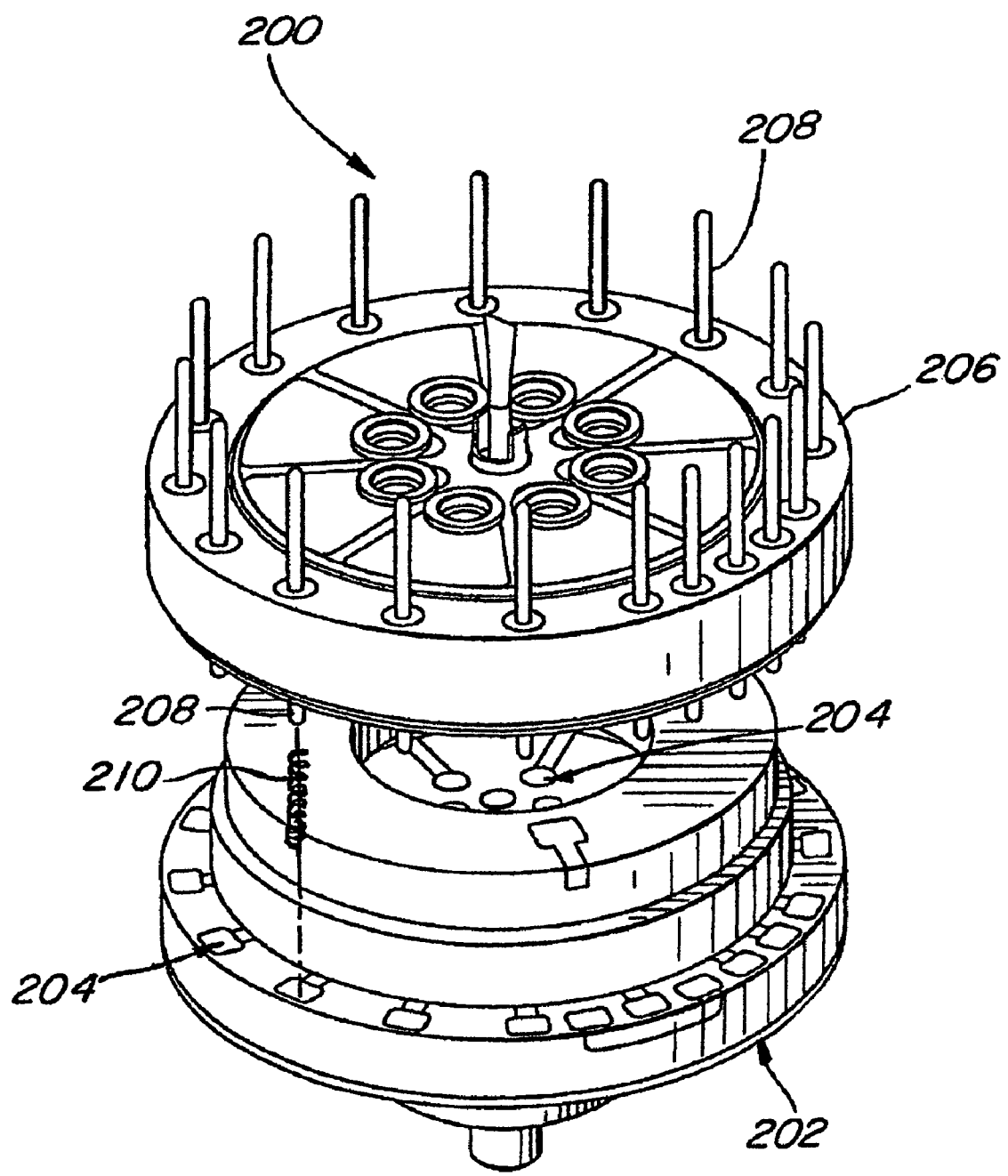
FIG. 2 shows the vibratory rotation sensor of FIG. 1 in conjunction with a header assembly, as known in the art.

The outer support member 12, inner support member 16, and resonator 14 are vacuum sealed to form an HRG subassembly which is depicted by the numeral 202 in FIG. 2. In order to provide electrical connections to external circuitry, a header assembly 206 is provided. A plurality of electrical contact pins 208 are provided in the header assembly 206 in order to make electrical contact with electrical contact pads 204 disposed on exterior surfaces of the HRG subassembly 202. In order to provide appropriate mechanical isolation between the HRG subassembly 202 and the header assembly 206, contact springs 210 may be utilized as part of the electrical pin 208 to contact pad 204 interconnection. The electrical contact pins 208 provide electrical connection to the HRG subassembly 202 for both input and output electrical signals.

Figure 3:
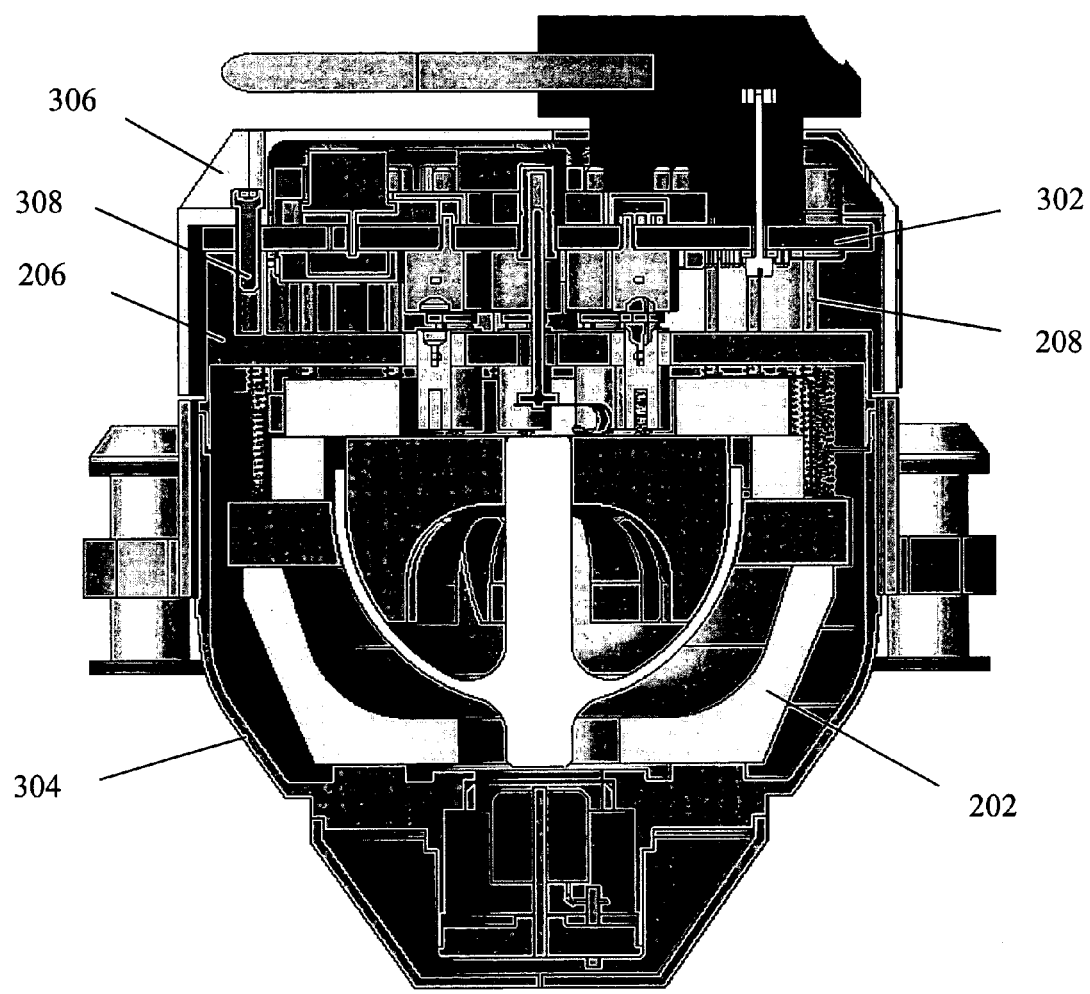
FIG. 3 is a section view of a complete HRG device.

FIG. 3 is a section view of a complete HRG device in which the HRG subassembly 202 is placed into a mechanical housing that includes lower housing 304 and upper housing 306. The HRG subassembly 202 is similar to the HRG subassembly 202 depicted in FIG. 2; however, specific details of the HRG subassembly 202 are not necessary for an understanding of the present invention. Consequently, details of the HRG subassembly 202 are omitted from FIG. 3.

A circuit board 302 is electrically connected to the header assembly 206 via electrical contact pins 208. The circuit board 302, sometimes designated a "printed wiring board" or PWB, includes electronic circuits that provide both excitation and sensing capabilities for use with the HRG assembly 202. The upper housing 306 is secured to the header assembly 206 by cover screws 308. The header assembly 206 is preferably hermetically sealed to the HRG assembly 202. In the mounting arrangement illustrated in FIG. 3, the circuit board 302 is effectively "sandwiched" between the upper housing 306 and the header assembly 206, in order to provide a secure mechanical mounting for the circuit board 302.

In the illustrated implementation, the circuit board 302 is a polyclad polyimide circuit board manufactured in accordance with IPC 4101/40 or /41. As is well-known, the IPC was originally the Institute for Printed Circuits, then changed its name to Institute for Interconnecting and Packaging Electronic Circuits. IPC is now the formal name of the organization, which, among other things, establishes standards for printed circuit boards that have been widely adopted throughout the industry. Of course, other printed circuit constructions, such as G-10 or FR4, for example, may also be suitable in this context, depending upon the ultimate application of the HRG device.

In environments where there are extreme excursions in operating temperature, the configuration illustrated in FIG. 3 may result in unacceptable temperature stresses due to the "sandwich" style mounting of the circuit board 302 between the upper housing 306 and the header assembly 206. The upper housing 306 may be termed a first housing element, while the header assembly 206 may be thought of as a second housing element, since the header assembly 206 contributes to the mechanical package integrity of the device. Since the interconnected subassemblies 306, 206, 302 generally have different coefficients of thermal expansion, or CTEs, temperature stress may occur to the circuit board 302 in particular, perhaps resulting in degraded operation of the completed device, or even premature failure.

Figure 4:
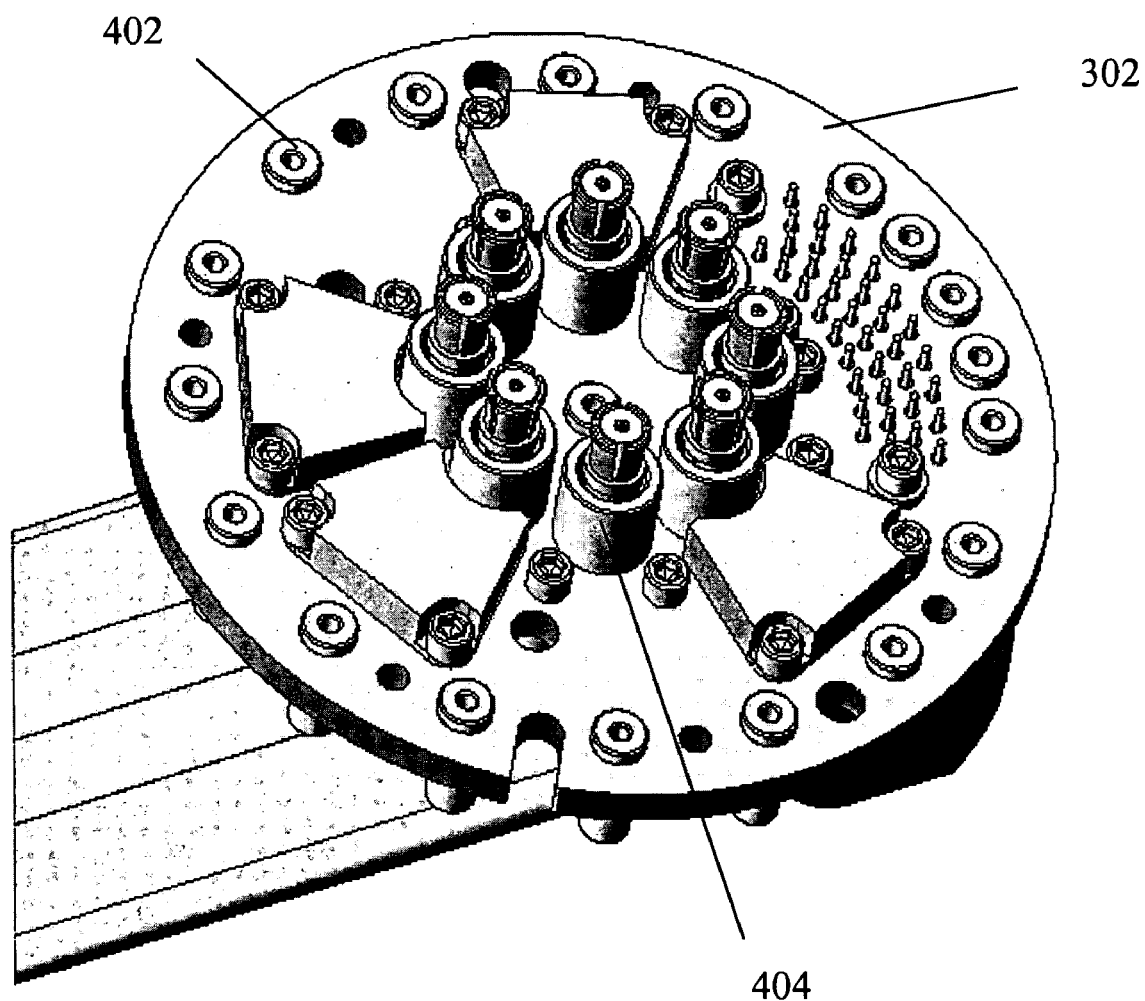
FIG. 4 illustrates a circuit board for use with the HRG device of FIG. 3.

FIG. 4 provides a detail view of the circuit board 302, illustrating the electrical contacts 402 that are designed to mate with pins 208 extending from the header assembly 206. There are also RF (radio frequency) type connectors 404 illustrated in FIG. 4. These RF connectors 404 are designed to mate with similar RF connectors extending from the header assembly 206, although details of this interconnection are not illustrated in the drawings. In this implementation, the circuit board is approximately 0.075 inch thick, although physical dimensions are, of course, largely dictated by the specific application.

Figure 5:
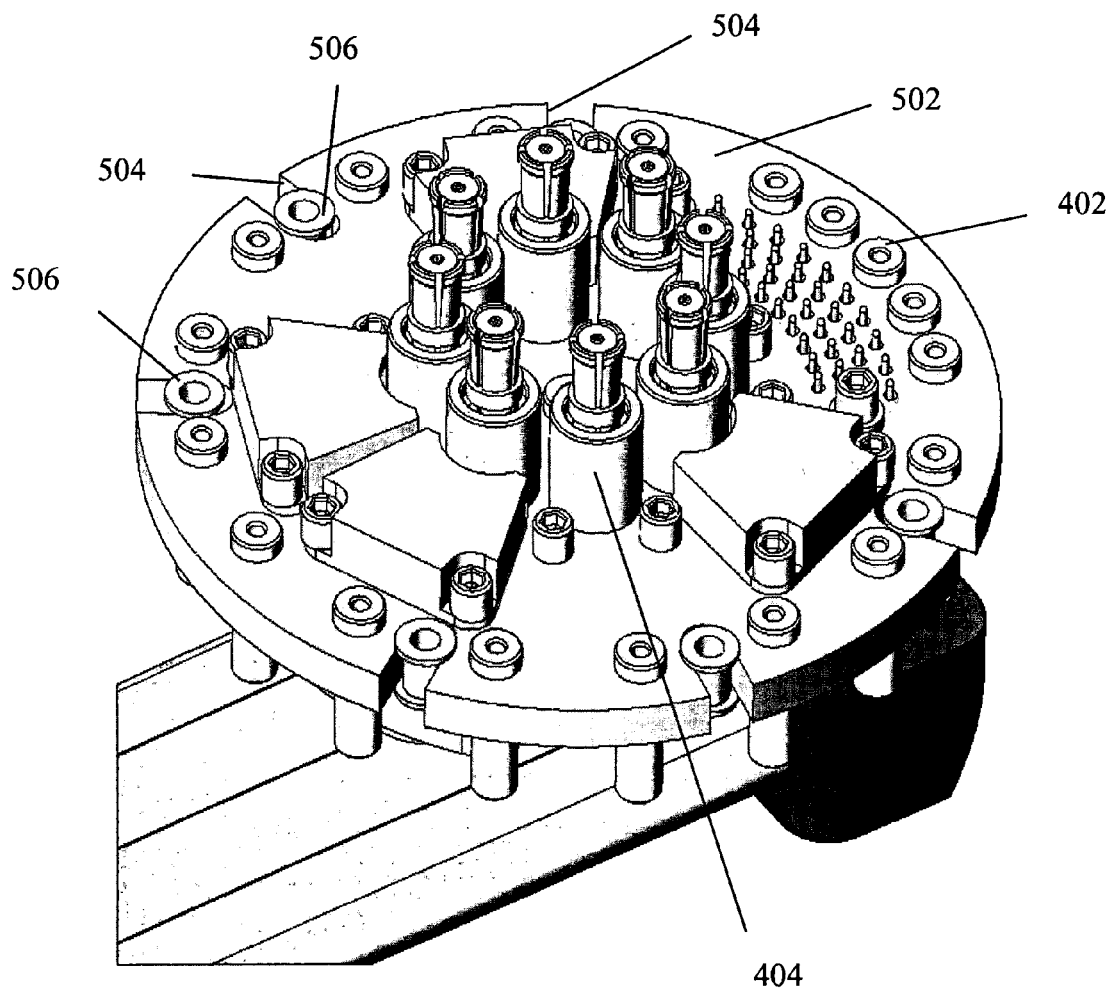
FIG. 5 depicts a modified circuit board in accordance with an exemplary implementation of the invention.

To improve performance of the HRG device over extremes of operating temperature, a modified circuit board 502 is illustrated in FIG. 5. A plurality of slots 504 are provided with the longitudinal axes of the slots 504 arranged radially around the circuit board 502. In the illustrated implementation, the open ends of the slots actually penetrate the circumference of the circuit board, which is generally circular, although, in the alternative, one or more of the slots 504 could be completely surrounded by circuit board material. Disposed within at least some of the slots are a plurality of bushings 506. In the illustrated implementation, the bushings 506 are formed from Kovar, which is an alloy of iron, nickel, and cobalt, although other formulations may also perform adequately depending upon environmental factors.

Figure 6:
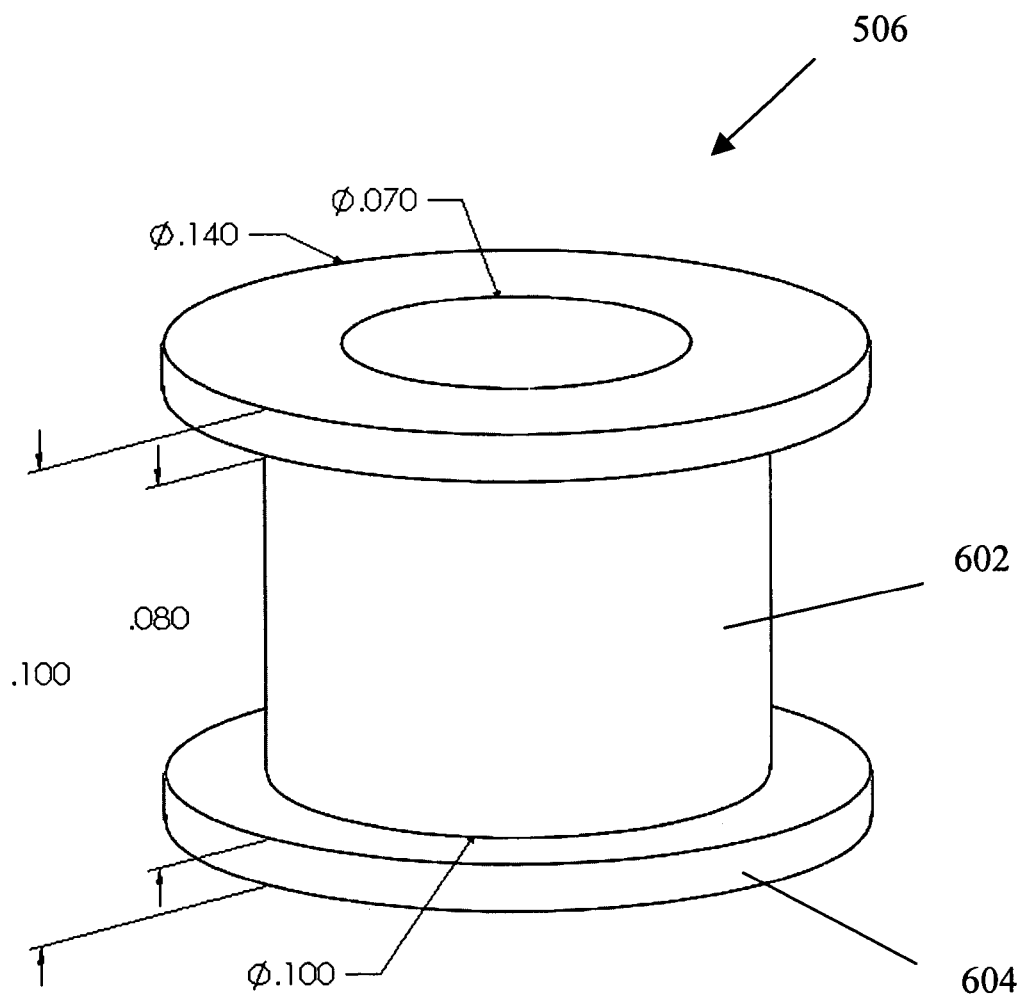
FIG. 6 is a representation of a bushing.

FIG. 6 depicts the physical structure of the bushing 506. The bushing 506 includes a body portion 602 that is preferably about 0.080 inch in length, with the body portion 602 being defined by opposed flanges 604 integrally formed at opposing ends of the body 602. In the illustrated implementation, each of the flanges 604 has a thickness of about 0.010 inch, resulting in an overall length for the bushing 506 of about 0.100 inch. An opening of about 0.070 inch diameter is provided through the bushing 506 to accommodate mounting screws, studs, or other mounting features, as appropriate. The outside diameter of the illustrated bushing 506, measured around the flange 604, is about 0.140 inch.

Figure 7:
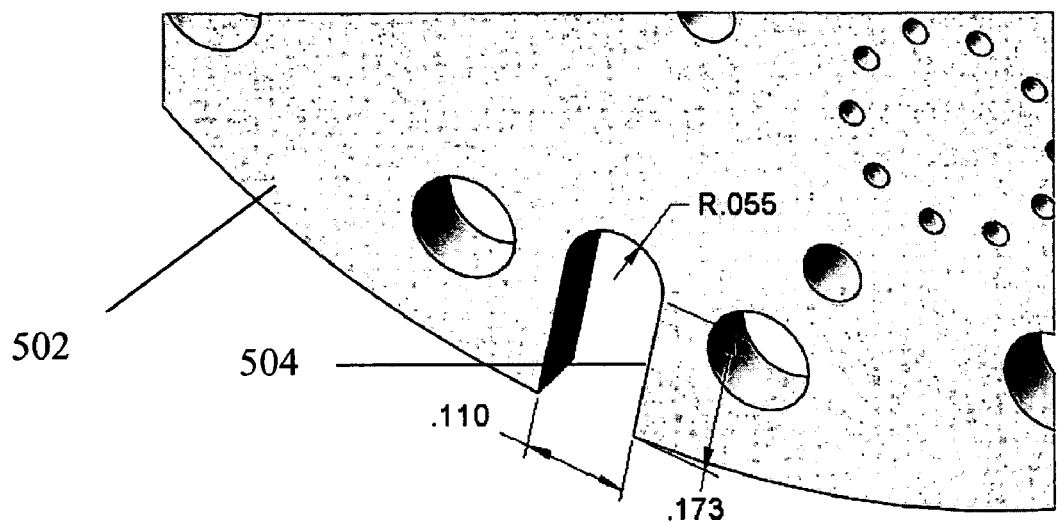
FIG. 7 is a detail view of a portion of the circuit board of FIG. 5.

FIG. 7 is a detail view of a portion of the circuit board 502, illustrating the dimensions of the slots in one implementation. Each slot 504 is about 0.110 in width, and has a radius at its inner extremity of about 0.055 inch. Thus, the overall length for the illustrated slot 504 is about 0.228 inch. As noted above, the illustrated slot 504 actually has an open end at the outer periphery of the circuit board 502, but it is not necessary that the slot actually penetrate the perimeter of the circuit board 502. In fact, although the illustrated circuit board 502 is generally circular in layout, the mounting technique described herein would work equally well for circuit boards of other general shapes, such as rectangular or square.

Figure 8:
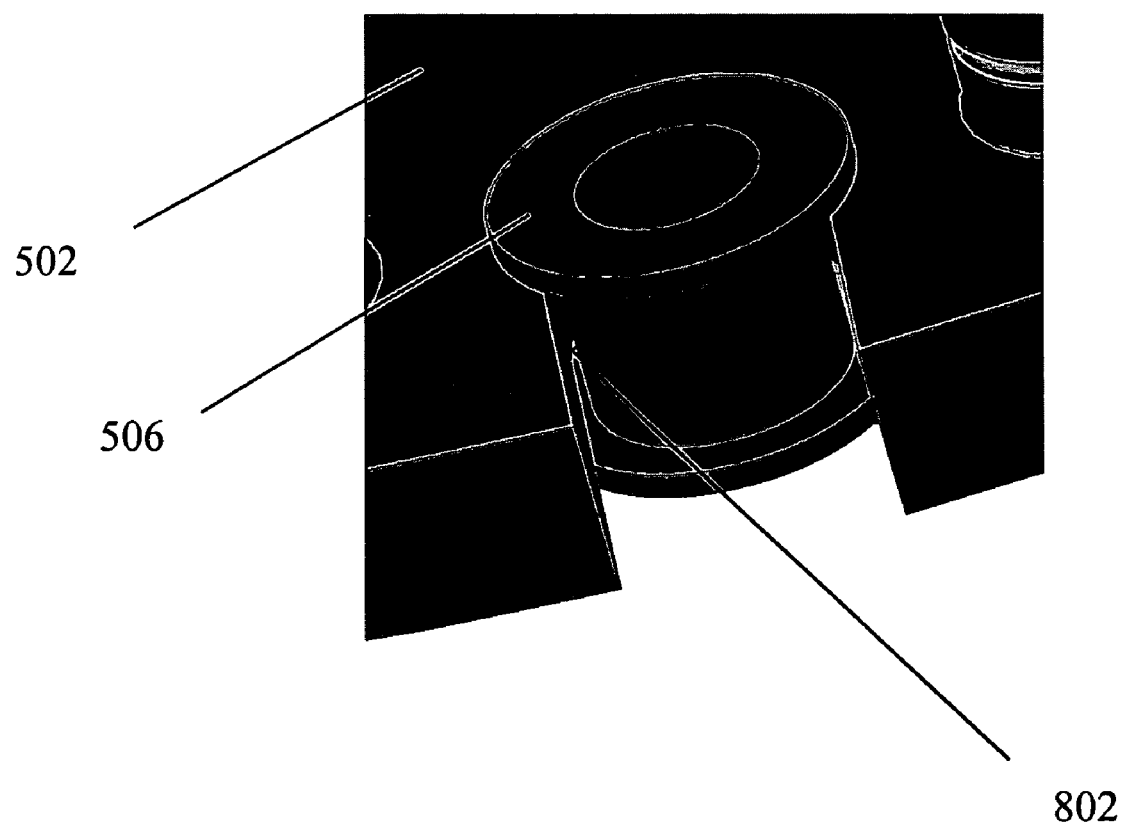
FIG. 8 is a detail view of a portion of the circuit board of FIG. 5, illustrating bushing placement.

FIG. 8 illustrates a bushing 506 disposed within a slot in circuit board 502. In the illustrated embodiment, a small amount of a compliant epoxy is applied between the bushing 506 and the slot. The epoxy compound may be Unistake tacking epoxy manufactured by Aptek, for example, although other formulations may also perform adequately. Also, it should be noted that the addition of tacking epoxy may not be necessary in all implementations, and its use may be dictated by particular circumstances.

Figure 9:
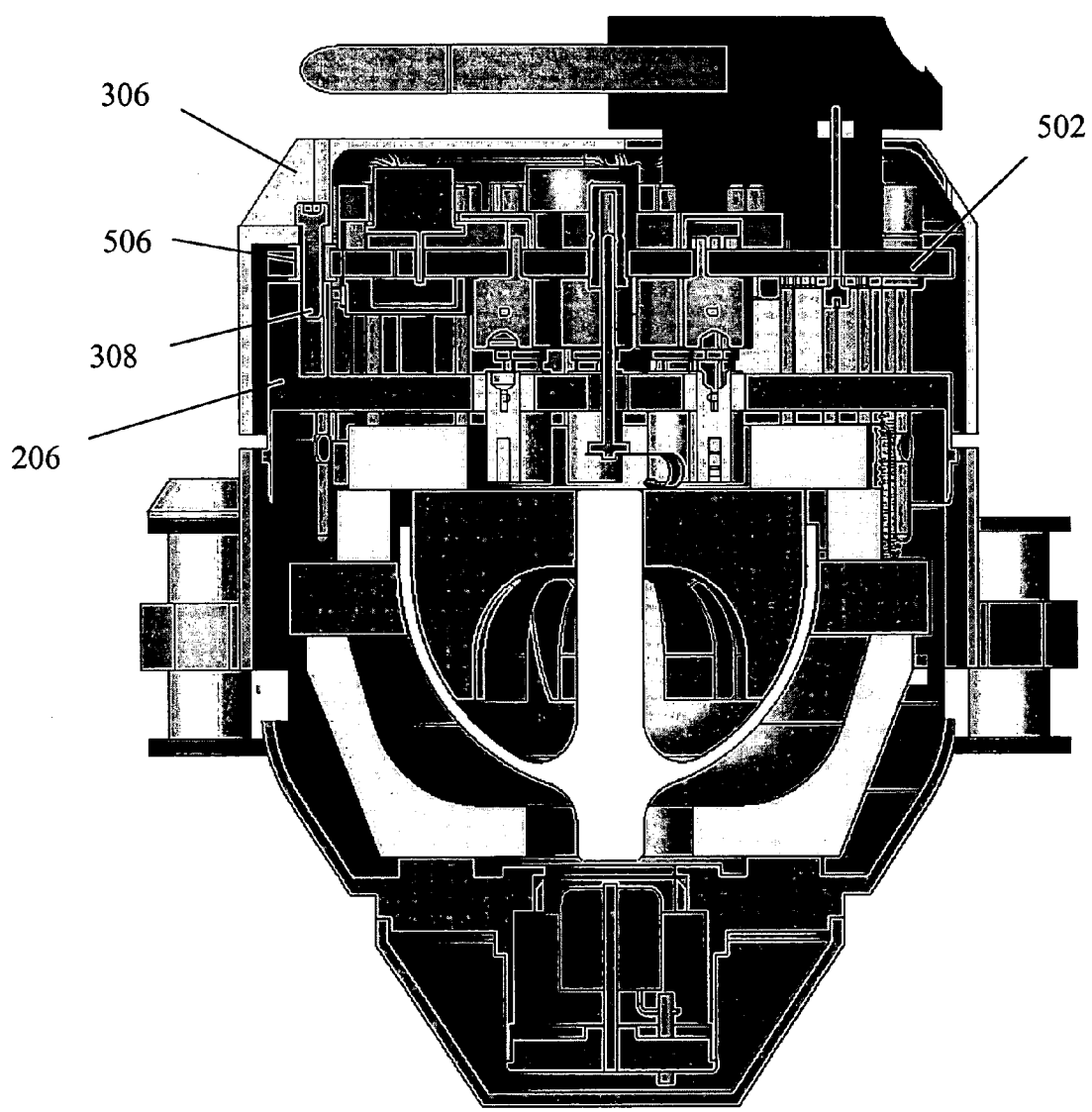
FIG. 9 is a section view of a complete HRG device in accordance with an exemplary implementation of the invention.

FIG. 9 is a section view of a completed HRG device illustrating the "floating" mounting system provided for circuit board 502. Rather than creating a sandwich structure around the circuit board, the mounting detail illustrated in FIG. 9 shows that the upper housing 306 and the header assembly 206 actually bear on the flanges of the bushings 506 rather than directly on the circuit board material. Attachment screws 308 hold the upper housing 306 and the header assembly 206 together, allowing the circuit board 502 to float. This ensures that the circuit board 502 can move at least slightly in a radial direction as the housing elements 306 and 206 expand and contract with temperature. Of course, the circuit board 502 also expands and contracts with temperature, generally at yet a different rate than the housing elements 306 and 206. The radial motion of the floating circuit board 502 may be thought of as movement in a plane generally parallel to the mounting surfaces of the circuit board 502. And, of course, where the circuit board 502 has a rectangular or square form-factor, movement of the circuit board 502 should be thought of as planar with respect to the mounting surfaces rather than radial with respect to the center of a generally circular circuit board. The flanges of the bushings 506 generally restrict movement of the circuit board 502 in an axial direction; that is, generally normal to the mounting surfaces of the circuit board 502.

Figure 10:
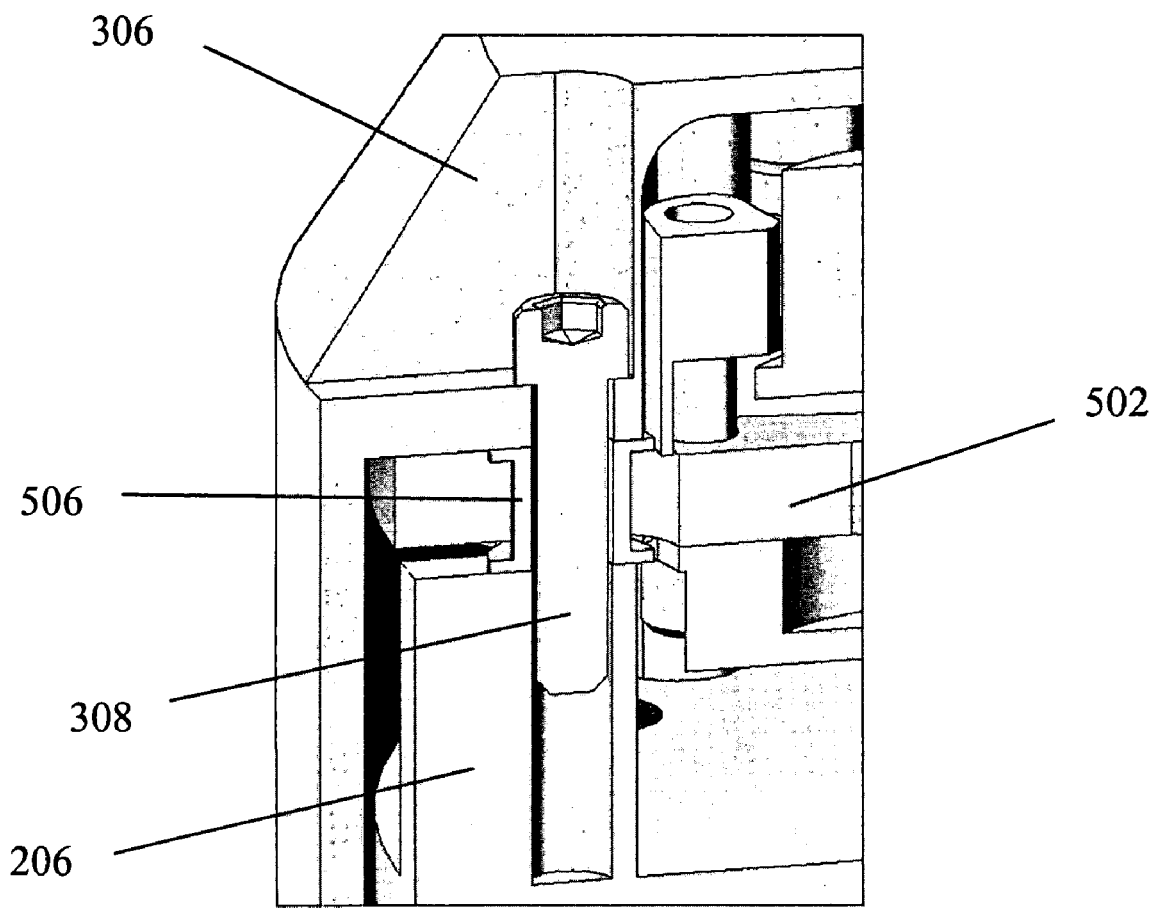
FIG. 10 is a detail view of a portion of FIG. 9.

FIG. 10 is a detail view of a portion of FIG. 9, illustrating the floating mounting of the circuit board 502 in greater detail. As can be appreciated from an examination of FIG. 10, the circuit board 502 effectively floats within the limits established by the exterior dimensions of the bushings 506. The header assembly 206, for example, is in close mechanical contact with the bushings 506 rather than the circuit board 502. The same condition applies to the mechanical contact of the upper housing 306. In this case as well, the upper housing 306 is in close mechanical contact with the bushings 506 rather than the circuit board 502.

The steps or operations described herein are just exemplary. There may be many variations to these steps or operations without departing from the spirit of the invention. For instance, the steps may be performed in a differing order, or steps may be added, deleted, or modified.

Although exemplary implementations of the invention have been depicted and described in detail herein, it will be apparent to those skilled in the relevant art that various modifications, additions, substitutions, and the like can be made without departing from the spirit of the invention and these are therefore considered to be within the scope of the invention as defined in the following claims.

What is claimed is:

1. An improved mounting system for a circuit board disposed between housing elements, the improvement comprising:
   a plurality of slots formed in the circuit board;
   a plurality of bushings disposed within the slots, the slots being moveable relative to the bushings, wherein the plurality of bushings are formed from Kovar;
   such that the housing elements rest on opposed ends of the bushings, and the circuit board moves in a plane substantially parallel to the mounting surfaces of the circuit board in response to changes in temperature, thus reducing thermal stress during operation of the mounting system.

2. The improved mounting system of claim 1, wherein the circuit board is substantially circular, and movement in a plane substantially parallel to the mounting surfaces of the circuit board comprises movement along a circuit board radius.

3. The improved mounting system of claim 2, wherein the slots are radially disposed in the circuit board.

4. The improved mounting system of claim 1, wherein the bushings are substantially cylindrical.

5. The improved mounting system of claim 4, wherein the bushings further include integrally formed flanges disposed at opposing ends of the bushings.

6. The improved mounting system of claim 1, wherein the bushings are restrained within the slots by an application of compliant adhesive.

7. The improved mounting system of claim 2, wherein the compliant adhesive comprises an epoxy resin.

8. The improved mounting system of claim 1, wherein the slots are disposed proximate a circuit board perimeter.

9. The improved mounting system of claim 8, wherein the slots extend through the circuit board perimeter, providing openings therein.

10. The improved mounting system of claim 1, wherein the housing elements further comprise a first housing element corresponding to an upper housing, and a second housing element corresponding to a header assembly.

11. A method for mounting a circuit board, the method comprising the steps of:
    providing a circuit board disposed within first and second housing elements;
    providing a plurality of slots in the circuit board;
    disposing a plurality of bushings within the slots; and the slots being moveable relative to the bushings, wherein the plurality of bushings are formed from Kovar; and
    resting the housing elements on opposed ends of the bushings;
    such that the circuit board moves in a plane substantially parallel to the mounting surfaces of the circuit board in response to changes in temperature, thus reducing thermal stress during operation of the mounting the circuit board.

12. The method in accordance with claim 11, wherein the circuit board is substantially circular, and the step of providing a plurality of slots further comprises the step of providing a plurality of slots radially disposed in the circuit board.

13. The method in accordance with claim 11, wherein the step of disposing a plurality of bushings within the slots further comprises the step of disposing a plurality of substantially cylindrical bushings within the slots, and wherein the cylindrical bushings include integrally formed flanges disposed at opposing ends of the bushings.

14. The method in accordance with claim 13, wherein the step of disposing a plurality of bushings within the slots further comprises the step of restraining the cylindrical bushings within the slots by an application of compliant adhesive.

15. The method in accordance with claim 12, wherein the step of providing a plurality of slots radially disposed in the circuit board further comprises the step of providing a plurality of radially disposed slots proximate a circuit board perimeter.

16. An electromechanical assembly comprising:
    an upper housing element;
    an electrical connection header assembly;
    a circuit board disposed between the upper housing element and the electrical header assembly, wherein the circuit board further includes:
    a plurality of slots formed in the circuit board; and
    a plurality of bushings disposed within the slots, the slots being moveable relative to the bushings, wherein the plurality of bushings are formed from Kovar;
    such that the upper housing element and the electrical header assembly rest on opposed ends of the bushings, and the circuit board moves in a plane substantially parallel to the mounting surfaces in response to changes in temperature, thus reducing thermal stress during operation of the electro-mechanical assembly.

17. The electro-mechanical assembly of claim 16, wherein the circuit board is substantially circular, and movement in a plane substantially parallel to the mounting surfaces of the circuit board comprises movement along a circuit board radius.

18. The electro-mechanical assembly of claim 17, wherein the slots are radially disposed in the circuit board.

19. The electro-mechanical assembly of claim 16, wherein the bushings are substantially cylindrical.

20. The electro-mechanical assembly of claim 19, wherein the bushings further include integrally formed flanges disposed at opposing ends of the bushings.

21. A hemispherical resonator gyro comprising:
a resonator disposed within interior and exterior support structures;
an upper housing element;
an electrical connection header assembly making electrical contact with the resonator;
a circuit board disposed between the upper housing element and the electrical header assembly, wherein the circuit board further includes:
a plurality of slots formed in the circuit board; and
a plurality of bushings disposed within the slots, the slots being moveable relative to the bushings, wherein the plurality of bushings are formed from Kovar;
such that the upper housing element and the electrical header assembly rest on opposed ends of the bushings, and the circuit board moves in a plane substantially parallel to the mounting surfaces of the circuit board in response to changes in temperature, thus reducing thermal stress during operation of the hemispherical resonator gyro.

22. The improved mounting system of claim 1, wherein the circuit board is a polyclad polyimide circuit board.

23. The improved mounting system of claim 1, wherein the circuit board expands and contracts with the temperature at a different rate than the housing elements.

24. The improved mounting system of claim 1, wherein an opening is provided through each of the plurality of bushings to accommodate mounting screws, studs, or other mounting features.

25. The improved mounting system of claim 1, wherein the slots are one of open-ended and completely surrounded by material of the circuit board.

26. The method of claim 11, wherein the slots are one of open-ended and completely surrounded by material of the circuit board.

27. The electro-mechanical assembly of claim 16, wherein the slots are one of open-ended and completely surrounded by material of the circuit board.

28. The hemispherical resonator gyro of claim 21, wherein the slots are one of open-ended and completely surrounded by material of the circuit board.

29. A hemispherical resonator gyro comprising:
a resonator disposed within interior and exterior support structures;
an upper housing element;
an electrical connection header assembly operatively coupled to the resonator;
a circuit board disposed between the upper housing element and the electrical header assembly, wherein the circuit board further includes:
a plurality of slots formed in the circuit board, the slots being one of open-ended and completely surrounded by material of the circuit board; and
a plurality of bushings disposed within the slots, the slots being moveable relative to the bushings and at least some of the slots having a plurality of bushings, wherein the plurality of bushings are formed from Kovar;
a predetermined amount of a compliant epoxy disposed between each of the bushings and a respective slot;
the header assembly being in close mechanical contact with respective bushings of the plurality of bushings rather than the circuit board, and the upper housing element being in close mechanical contact with respective bushings of the plurality of bushings rather than the circuit board; and
the header assembly, the upper housing element, and the circuit board having different coefficients of thermal expansion;
such that the upper housing element and the electrical header assembly rest on opposed ends of the bushings, and the circuit board moves in a plane substantially parallel to the mounting surfaces of the circuit board in response to changes in temperature, thus reducing thermal stress during operation of the hemispherical resonator gyro.

* * * * *